(12) United States Patent
Prasantnakorn et al.

(10) Patent No.: US 7,969,749 B2
(45) Date of Patent: Jun. 28, 2011

(54) ELECTRONIC DEVICE HAVING POWER CONNECTION INTERFACE

(75) Inventors: Chanwit Prasantnakorn, Amphur Muang (TH); Chin-Huat Lim, Amphur Muang (TH); Ran Li, Amphur Muang (TH)

(73) Assignee: Delta Electronics (Thailand) Public Co., Ltd., Amphur Muang (TH)

( * ) Notice: Subject to any disclaimer, the term of this patent is extended or adjusted under 35 U.S.C. 154(b) by 962 days.

(21) Appl. No.: 11/839,282

(22) Filed: Aug. 15, 2007

(65) Prior Publication Data
US 2008/0264674 A1 Oct. 30, 2008

(30) Foreign Application Priority Data

Apr. 27, 2007 (TW) .............................. 96115181 A

(51) Int. Cl.
*H01R 9/00* (2006.01)

(52) U.S. Cl. ..................... 361/823; 361/748; 439/59

(58) Field of Classification Search .................. 361/823, 361/760, 720, 736, 748, 767, 777, 776; 439/59, 439/399
See application file for complete search history.

(56) References Cited

U.S. PATENT DOCUMENTS

| | | | | |
|---|---|---|---|---|
| 5,210,855 A | * | 5/1993 | Bartol | 710/302 |
| 5,319,523 A | * | 6/1994 | Ganthier et al. | 361/753 |
| 5,764,489 A | * | 6/1998 | Leigh et al. | 361/777 |
| 6,096,980 A | * | 8/2000 | Ferry | 174/261 |
| 6,233,560 B1 | * | 5/2001 | Tannenbaum | 704/275 |
| 6,710,266 B2 | * | 3/2004 | Mix et al. | 174/261 |

* cited by examiner

*Primary Examiner* — Hung S Bui
(74) *Attorney, Agent, or Firm* — Kirton & McConkie; Evan R. Witt

(57) ABSTRACT

An electronic device includes a circuit board and a power connection interface. The power connection interface is formed on an edge region of the circuit board. The power connection interface includes a first trace portion for transmitting a DC voltage and second and third trace portions for transmitting an AC voltage. Plural trace wires of the first trace portion are arranged on first and second surfaces of the edge region. The second and third trace portions are arranged on opposite surfaces of the edge region.

15 Claims, 5 Drawing Sheets

ELECTRONIC DEVICE HAVING POWER CONNECTION INTERFACE

FIELD OF THE INVENTION

The present invention relates to an electronic device having a power connection interface, and more particularly to a power supply apparatus having a power connection interface.

BACKGROUND OF THE INVENTION

Power supply apparatuses are essential for many electronic appliances such as personal computers, industrial computers, servers, communication products or network products. Normally, the power supply apparatus may provide stable electricity to the electronic appliance. In a case that the power supply apparatus has a breakdown, the electronic appliance is possibly damaged or the data stored in the electronic appliance is lost. For enhancing capacity and reliability of power supply, a redundant power supply system has been proposed. The redundant power supply system includes a plurality of separated power supply apparatuses, which are electrically coupled to each other and contained in a system cabinet. During operation of the redundant power supply system, individual power supply apparatuses share responsibility for providing electricity to the electronic appliance. If one of the power supply apparatuses has a breakdown and fails to normally provide electricity, the others could continuously provide electricity to the loads.

Referring to FIG. 1, a schematic exploded view of a conventional redundant power supply system is illustrated. The redundant power supply system 1 principally includes a system cabinet 10, a first power supply apparatus 11 and a second power supply apparatus 12. The system cabinet 10 includes a first receptacle 102 and a second receptacle 103, which are separated by a partition plate 101. The first power supply apparatus 11 and the second power supply apparatus 12 are accommodated within the first receptacle 102 and the second receptacle 103, respectively. The redundant power supply system 1 further includes a backside plate 13 inside the system cabinet 10. A first insertion slot 131 and a second insertion slot 132 are disposed on the backside plate 13. A first power connection interface 111 of the first power supply apparatus 11 and a second power connection interface 121 of the second power supply apparatus 12 are respectively inserted into the first insertion slot 131 and the second insertion slot 132 so as to be electrically connected to the backside plate 13. A power cable 14 is extended from the outer surface of the backside plate 13, so that the electricity provided by the redundant power supply system 1 is transmitted to an electronic appliance via the power cable 14.

Please refer to FIG. 2, which is a schematic perspective view illustrating the first power connection interface of the first power supply apparatus shown in FIG. 1. The configuration of the second power connection interface 121 of the second power supply apparatus 12 is substantially identical to that of the first power connection interface 111 of the first power supply apparatus 11. For clarification and brevity, only the first power connection interface 111 of the first power supply apparatus 11 is described. As shown in FIG. 2, an edge region 1120 of a circuit board 112 is extended externally from the casing of the first power supply apparatus 11. The first power connection interface 111 is formed on the edge region 1120 of the circuit board 112, and principally includes plural trace portions 113. Generally, the trace portions 113 includes a first trace portion 1131, a second trace portion 1132, a third trace portion 1133 and a fourth trace portion 1134. The first trace portion 1131 is used for transmitting a DC voltage. The second trace portion 1132 and the third trace portion 1133 are used for transmitting an AC voltage. The fourth trace portion 1134 is used as an earth wire. The first trace portion 1131 includes several trace wires, which are discretely arranged at regular intervals on both surfaces 1121 and 1122 of the edge region 1120 of the circuit board 112. The second trace portion 1132 and the third trace portion 1133 are arranged on the same surface of the edge region 1120, e.g. the first surface 1121 of the edge region 1120. For example, the second trace portion 1132 and the third trace portion 1133 are a neutral wire and a live wire, respectively. When the first power supply apparatus 11 is accommodated within the system cabinet 10, the AC voltage is inputted into the power converting circuit of the first power supply apparatus 11 through the second trace portion 1132 and the third trace portion 1133, and the AC voltage is converted by the power converting circuit into a regulated DC voltage. The regulated DC voltage is outputted to power an external electronic appliance through the first trace portion 1131.

For safety regulations of avoiding short-circuit occurrence in the trace portions 113, the trace wires of the trace portions 113 should be discretely arranged at regular intervals. For example, there is at least a first safety interval d1 between every two adjacent trace wires of the first trace portion 1131. There is at least a second safety interval d2 between the second trace portion 1132 and the third trace portion 1133. In addition, there is at least a third safety interval d3 between the first trace portion 1131 and the second trace portion 1132. Generally, the third safety interval d3 is greater than the second safety interval d2, and the second safety interval d2 is greater than the first safety interval d1. Since the second trace portion 1132 and the third trace portion 1133 are arranged on the same surface of the edge region 1120, the second trace portion 1132 and the third trace portion 1133 occupy much area of the first surface 1121. In addition, it is necessary to reserve specific area on the edge region 1120 of the circuit board 112 for maintaining the safety interval between the second trace portion 1132 and the third trace portion 1133. Assuming that the width of the edge region 1120 of the circuit board 112 is constant, the number of trace wires of the first trace portion 1131 is limited due to such arrangement of the second trace portion 1132 and the third trace portion 1133. In addition, the reduced number of trace wires of the first trace portion 1131 may transmit insufficient electricity through the first power connection interface 111.

In views of the above-described disadvantages resulted from the conventional method, the applicant keeps on carving unflaggingly to develop an electronic device having a power connection interface according to the present invention through wholehearted experience and research

SUMMARY OF THE INVENTION

It is an object of the present invention to provide an electronic device having a power connection interface, in which the power connection interface has increased number of trace wires for transmitting DC voltages when the live wire and neutral wire are arranged on different surfaces of the circuit board, so that the amount of electricity transmitted by the power connection interface and the power density of the electronic device are both increased.

In accordance with an aspect of the present invention, there is provided an electronic device. The electronic device includes a circuit board and a power connection interface. The power connection interface is formed on an edge region of the circuit board. The power connection interface includes a first trace portion for transmitting a DC voltage and second and third trace portions for transmitting an AC voltage. Plural trace wires of the first trace portion are arranged on first and second surfaces of the edge region. The second and third trace portions are arranged on opposite surfaces of the edge region.

In accordance with another aspect of the present invention, there is provided an electronic device. The electronic device includes a circuit board and a power connection interface. The power connection interface is formed on an edge region of the circuit board. The power connection interface includes a trace portion for transmitting a DC voltage and at least a neutral wire and at least a live wire for transmitting an AC voltage. Plural trace wires of the trace portion are arranged on first and second surfaces of the edge region. The neutral wire and the live wire are arranged on opposite surfaces of the edge region.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention relates to an electronic device having a power connection interface, which is swappable to be embedded into an insertion slot within a system cabinet of a redundant power supply system in order to transmit electricity. The electronic device of the present invention includes but is not limited to a swappable power supply apparatus. Hereinafter, the present invention is illustrated by referring to a swappable power supply apparatus having a power connection interface.

Figure 3:
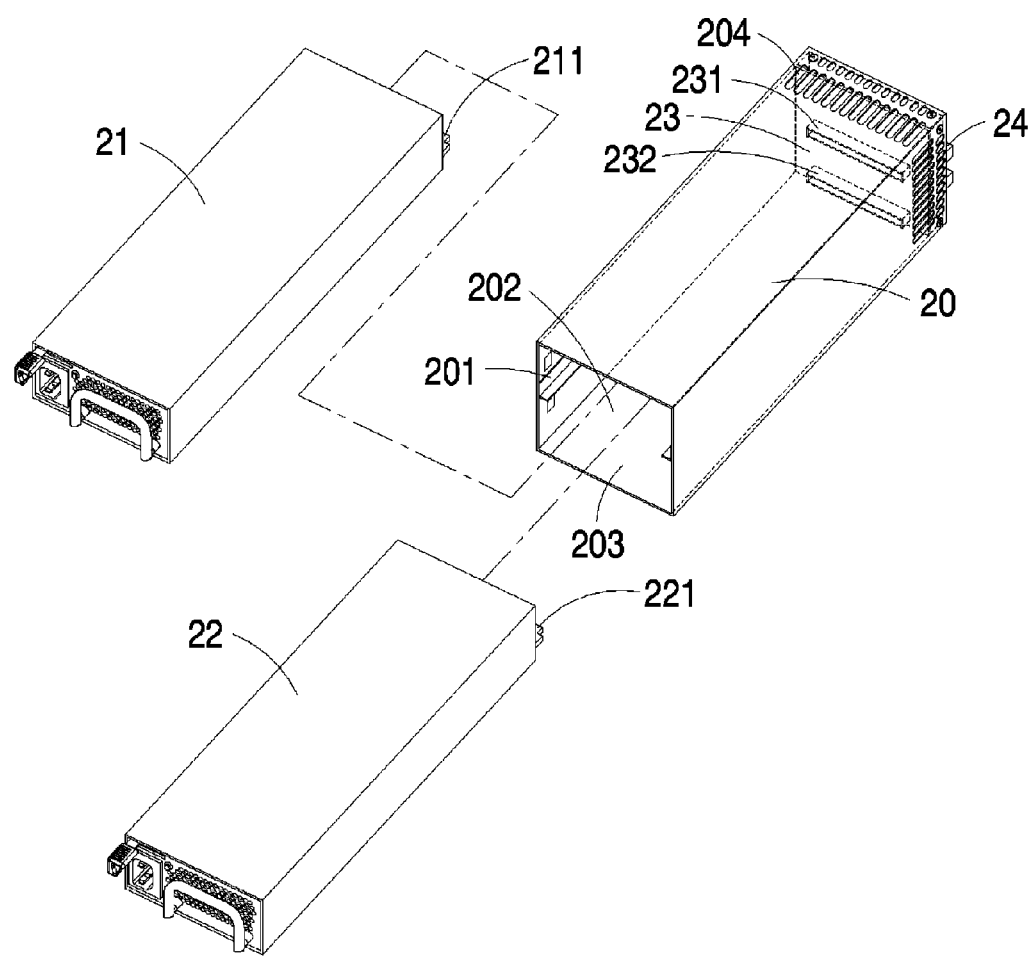
FIG. 3 is a schematic exploded view of a redundant power supply system according to a preferred embodiment of the present invention.

Referring to FIG. 3, a schematic exploded view of a redundant power supply system according to a preferred embodiment of the present invention is illustrated. The redundant power supply system 2 of FIG. 3 principally includes a system cabinet 20, a first power supply apparatus 21 and a second power supply apparatus 22. The system cabinet 20 includes a first receptacle 202 and a second receptacle 203, which are separated by a partition plate 201. The first power supply apparatus 21 and the second power supply apparatus 22 may be accommodated within the first receptacle 202 and the second receptacle 203, respectively. That is, the power supply apparatuses 21 and 22 are swappable to be embedded into the receptacles 202 and 203, respectively. The redundant power supply system 2 further includes a power converting circuit board 23 inside the system cabinet 20. For example, the power converting circuit board 23 include a DC/DC converting circuit. The power converting circuit board 23 is disposed on the inner surface of the backside of the system cabinet 20 and substantially perpendicular to the length direction of the system cabinet 20. The power converting circuit board 23 further includes a first insertion slot 231 and a second insertion slot 232, which are mounted on a first surface of the power converting circuit board 23. The first connection interface 211 of the first power supply apparatus 21 and the second connection interface 221 of the second power supply apparatus 22 are respectively inserted into the first insertion slot 231 and the second insertion slot 232 so as to be electrically connected to the power converting circuit board 23. In some embodiments, the first connection interface 211 and the second connection interface 221 are edge connectors, which are respectively disposed at edges of circuit boards (not shown) inside the first power supply apparatus 21 and the second power supply apparatus 22. At least a surface of the system cabinet 20 further includes plural ventilation holes 204 in the vicinity of the power converting circuit board 23. The airflow inhaled by the fans inside the first power supply apparatus 21 and the second power supply apparatus 22 may also remove a portion of heat from the power converting circuit board 23, and the heated air is exhausted through the ventilation holes 204 in order to enhance the heat-dissipating efficiency. Moreover, an electronic connector 24 is mounted on the backside of the power converting circuit board 23 and employed to couple with an external electronic appliance (not shown). In some embodiments, an edge region of a circuit board is extended externally from the casing of the first power supply apparatus 21. The first power connection interface 211 is formed on the edge region of the circuit board.

Figure 4:
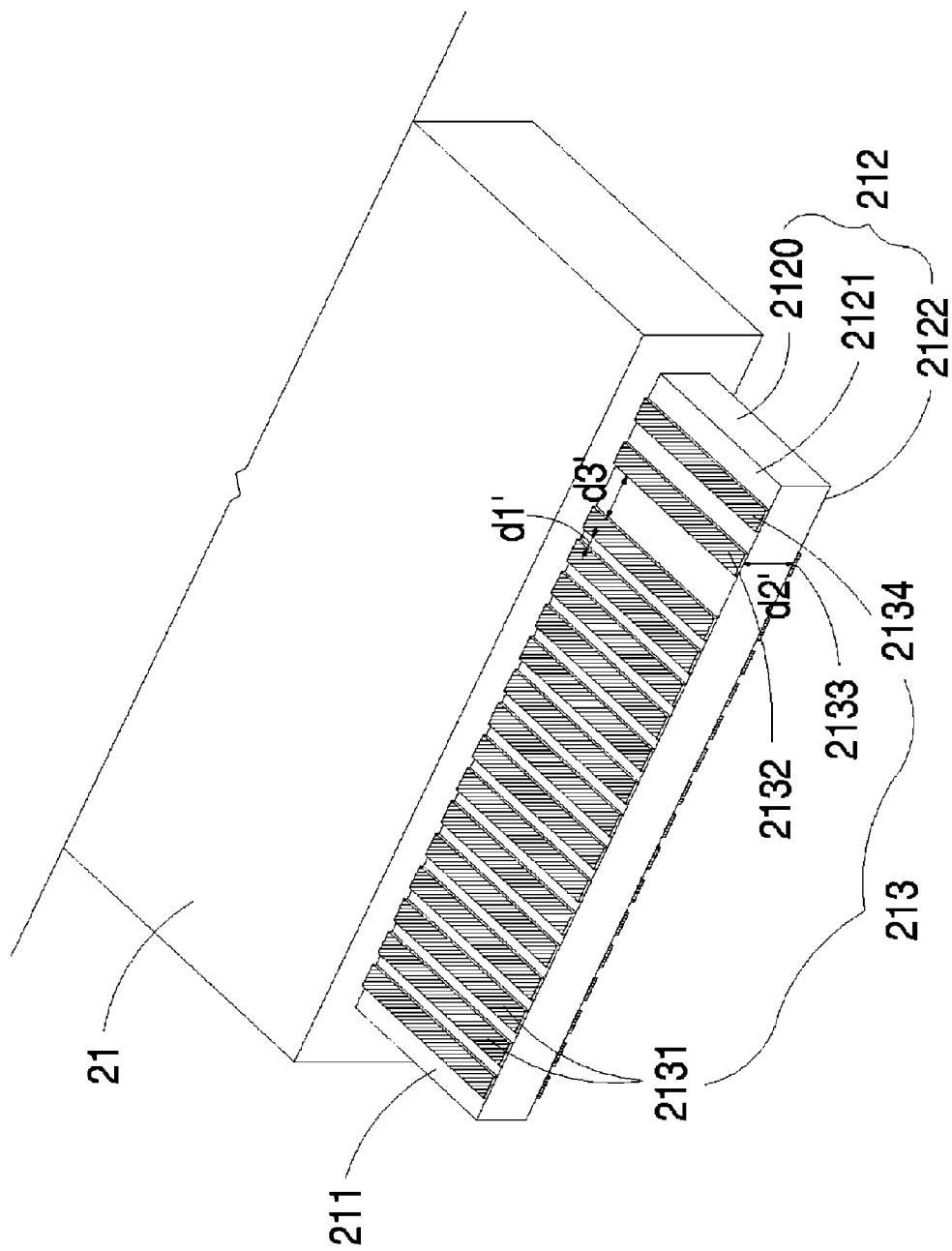
FIG. 4 is a schematic perspective view illustrating the first power connection interface of the first power supply apparatus shown in FIG. 3 according to a preferred embodiment of the present invention.

Please refer to FIG. 4, which is a schematic perspective view illustrating the first power connection interface of the first power supply apparatus shown in FIG. 3 according to a preferred embodiment of the present invention. The configuration of the second power connection interface 221 of the second power supply apparatus 22 is substantially identical to that of the first power connection interface 211 of the first power supply apparatus 21. For clarification and brevity, only the first power connection interface 211 of the first power supply apparatus 21 is described. As shown in FIG. 4, an edge region 2120 of a circuit board 212 is extended externally from the casing of the first power supply apparatus 21. The first power connection interface 211 is formed on the edge region 2120 of the circuit board 212, and principally includes plural trace portions 213. Generally, the trace portions 213 includes a first trace portion 2131, a second trace portion 2132, a third trace portion 2133 and a fourth trace portion 2134. The first trace portion 2131 is used for transmitting a DC voltage. The second trace portion 2132 and the third trace portion 2133 are used for transmitting an AC voltage. The fourth trace portion 2134 is used as an earth wire. The first trace portion 2131 includes several trace wires, which are discretely arranged at regular intervals on both surfaces 2121 and 2122 of the edge region 2120 of the circuit board 212. In accordance with a feature of the present invention, the second trace portion 2132 and the third trace portion 2133 are arranged on opposite surfaces of the edge region 2120. For example, the second trace portion 2132 and the third trace portion 2133 are arranged on the first surface 2121 and the second surface 2122 of the edge region 2120, respectively. In an embodiment, the second trace portion 2132 and the third trace portion 2133 are a neutral wire and a live wire, respectively. In another embodiment, the second trace portion 2132 and the third trace portion 2133 are a live wire and a neutral wire, respectively. When the first power supply apparatus 21 is accommodated within the system cabinet 20, the AC voltage is inputted into the power converting circuit of the first power supply apparatus 21 through the second trace portion 2132 and the third trace portion 2133, and the AC voltage is converted by the power converting circuit into a regulated DC voltage. The regulated DC voltage is outputted to power an external electronic appliance through the first trace portion 2131.

Figure 1:
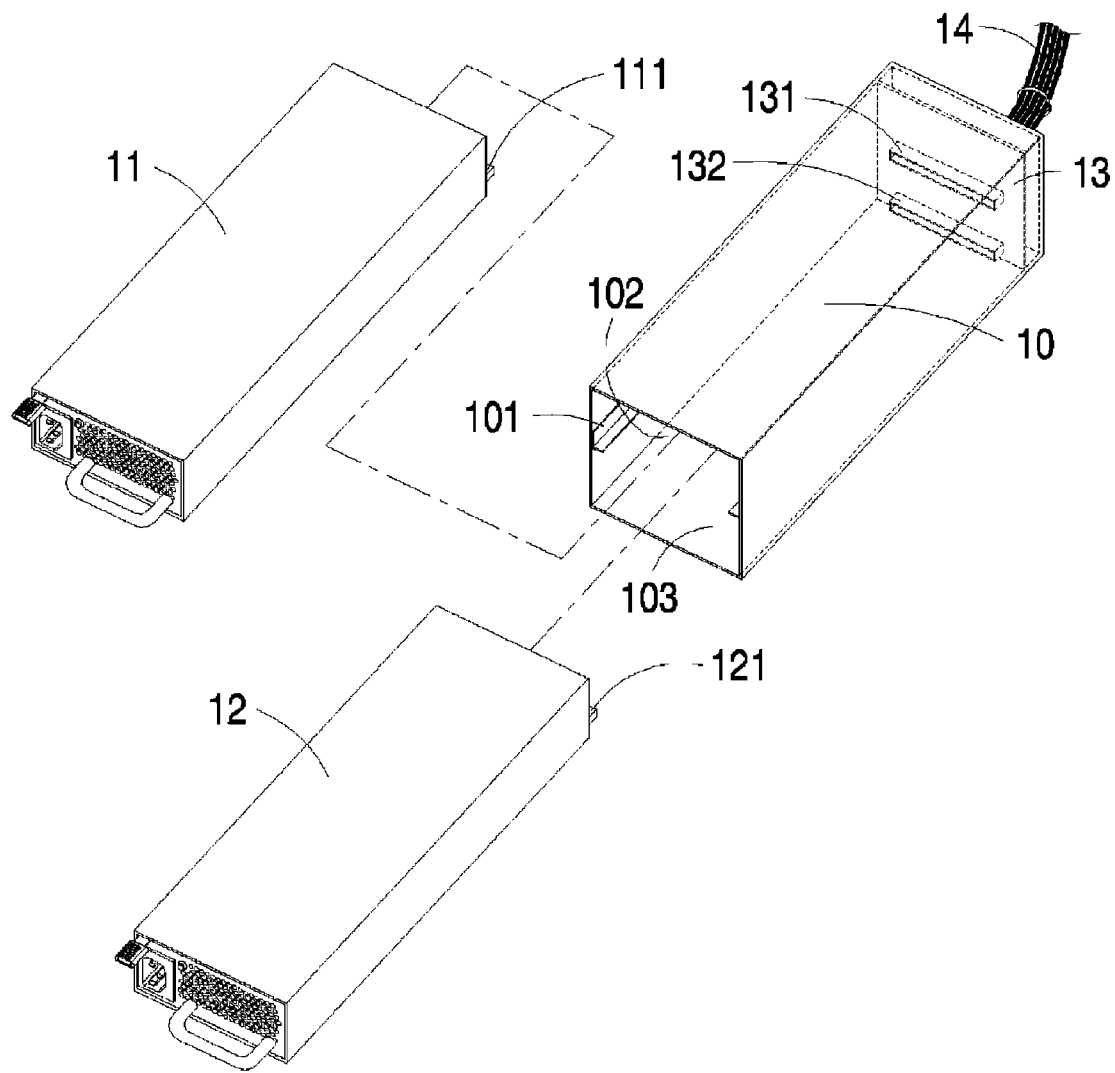
FIG. 1 is a schematic exploded view illustrating a conventional redundant power supply system.
Figure 2:
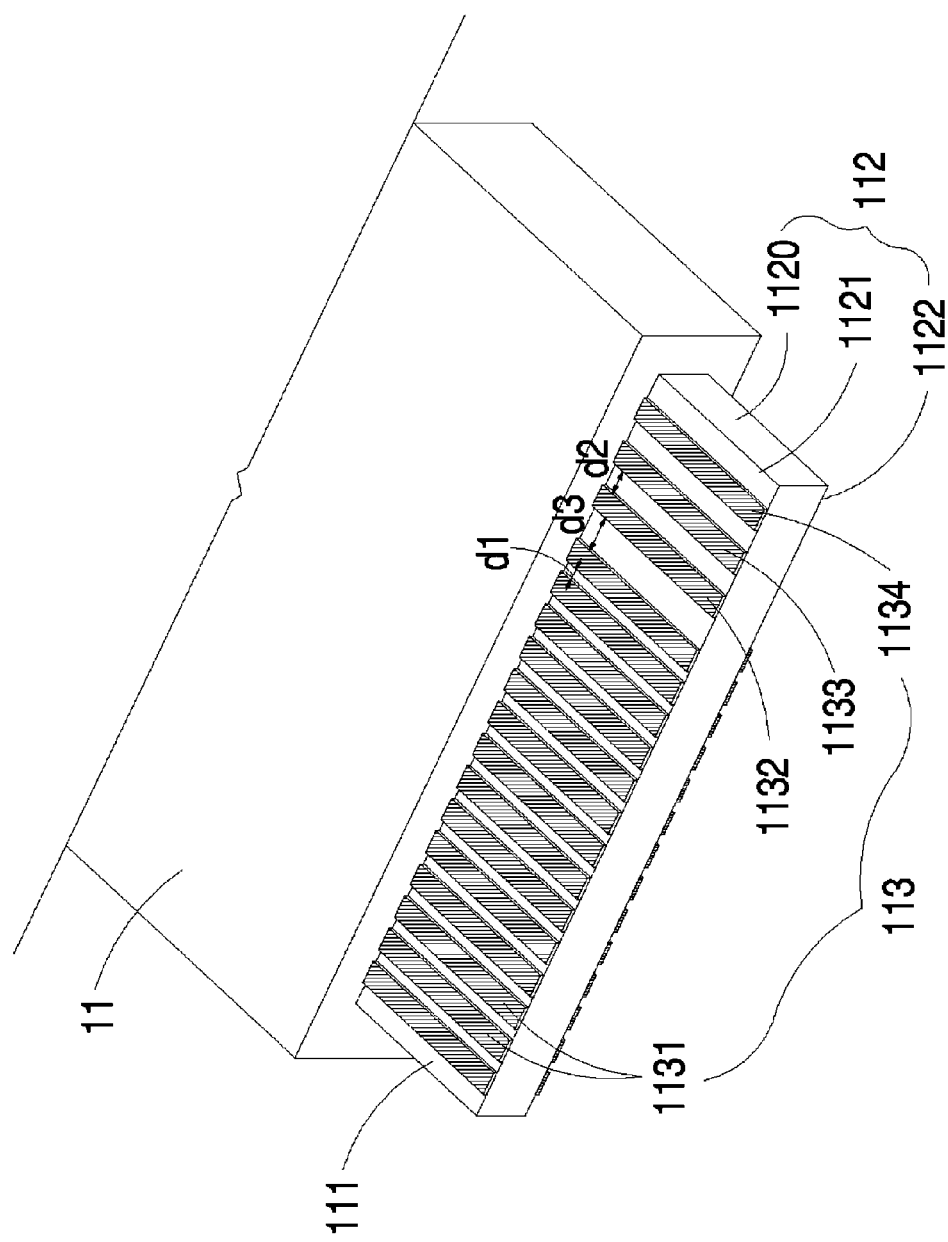
FIG. 2 is a schematic perspective view illustrating the first power connection interface of the first power supply apparatus shown in FIG. 1.

For safety regulations of avoiding short-circuit occurrence in the trace portions 213, the trace wires of the trace portions 213 should be discretely arranged at regular intervals. For example, there is at least a first safety interval d1' between every two adjacent trace wires of the first trace portion 2131. There is at least a second safety interval d2' between the second trace portion 2132 and the third trace portion 2133. In addition, there is at least a third safety interval d3' between the first trace portion 2131 and the second trace portion 2132. Generally, the third safety interval d3' is greater than the second safety interval d2', and the second safety interval d2' is greater than the first safety interval d1'. Since the second trace portion 2132 and the third trace portion 2133 are arranged on opposite surfaces of the edge region 2120, the second safety interval d2' is substantially equal to the thickness of the circuit board 212. As a consequence, no additional area of the same side needs to be reserved for maintaining the second safety interval d2' between the second trace portion 2132 and the third trace portion 2133. Assuming that the width of the edge region 2120 of the circuit board 212 is identical to that of the edge region 1120 of the circuit board 112 shown in FIG. 2, the number of trace wires of the first trace portion 2131 may be largely increased because the second trace portion 2132 and the third trace portion 2133 are arranged on opposite surfaces of the edge region 2120. Under this circumstance, the increased number of trace wires of the first trace portion 2131 may transmit more electricity through the first power connection interface 211. That is, the increased number of trace wires of the first trace portion 2131 may increase the overall power of the first power supply apparatus 21 and thus the power density of the first power supply apparatus 21 is increased.

Figure 5:
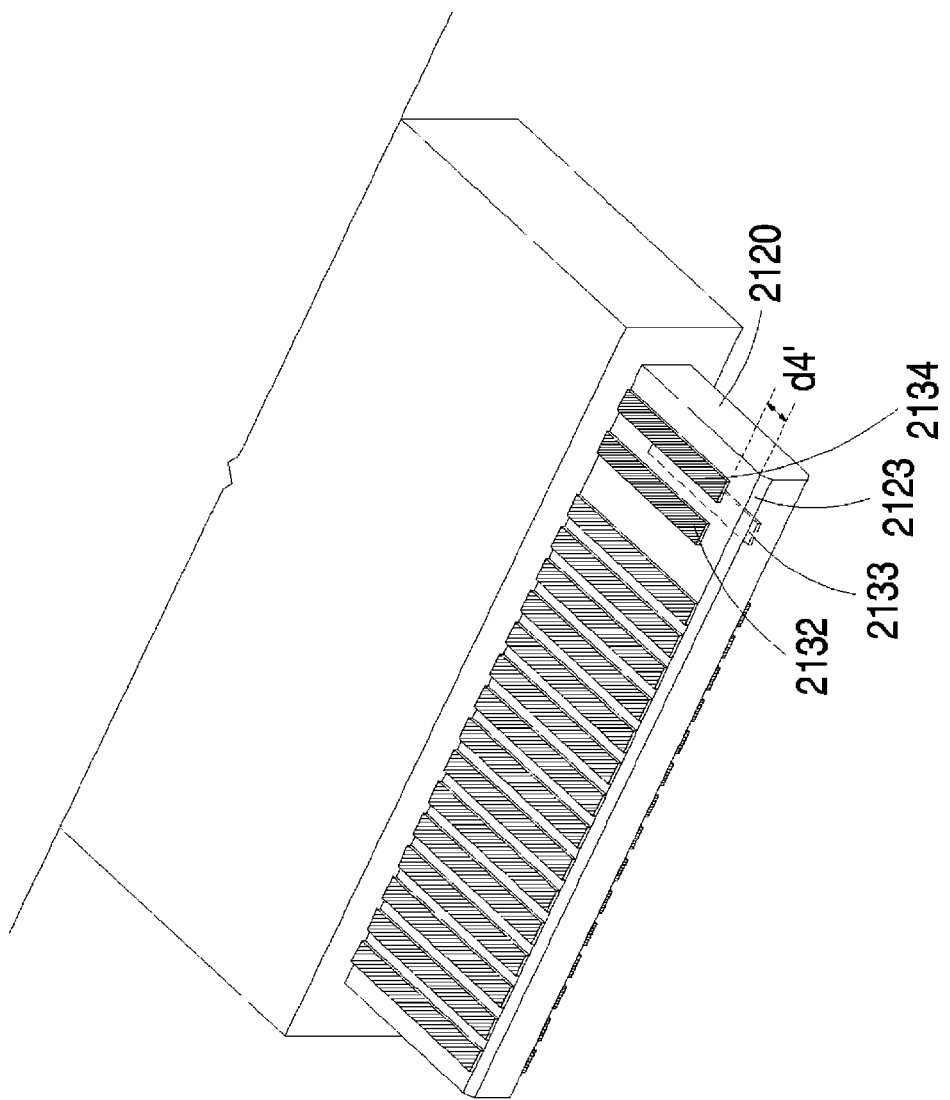
FIG. 5 is a schematic perspective view illustrating the first power connection interface of the first power supply apparatus shown in FIG. 3 according to another preferred embodiment of the present invention.

Please refer to FIG. 5, which is a schematic perspective view illustrating the first power connection interface of the first power supply apparatus shown in FIG. 3 according to another preferred embodiment of the present invention. As shown in FIG. 5, in order to ensure that the distance between the second trace portion 2132 and the third trace portion 2133 is enough to be maintained within a safety range, the ends of the second trace portion 2132 and the third trace portion 2133 can be shrunk with a specific distance d4' from the end edge of the edge region 2120 toward the first power supply apparatus 21, respectively. Therefore, the second safety interval d2' is substantially larger than the thickness of the circuit board 212. In another embodiment, the end edge of the edge region 2120 can be designed to have an oblique 2123 so that the edge region 2120 of the circuit board 212 can be inserted into the first insertion slot 231 easily.

From the above description, the power connection interface of the electronic device according to the present invention has increased number of trace wires for transmitting DC voltages because the live wire and neutral wire are arranged on different surfaces of the circuit board. Consequently, the amount of electricity transmitted by the power connection interface is increased and the power density of the electronic device is increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device comprising:
 a circuit board; and
 a power connection interface formed on an edge region of said circuit board, and including a first trace portion for transmitting a DC voltage and second and third trace portions for transmitting an AC voltage, wherein plural trace wires of said first trace portion are arranged on first and second surfaces of said edge region, and said second and third trace portions are arranged on opposite surfaces of said edge region, wherein said second and third trace portions are arranged on said first and second surfaces of said edge region, respectively.

2. The electronic device according to claim 1 wherein said power connection interface further includes an earth wire disposed on one of said first and second surfaces of said edge region.

3. The electronic device according to claim 1 wherein said second and third trace portions are neutral wire and live wire, respectively.

4. The electronic device according to claim 1 wherein said trace wires of said first trace portion are discretely arranged at regular intervals on both surfaces of said edge region of said circuit board.

5. The electronic device according to claim 1 wherein said second trace portion is opposed to said third trace portion.

6. The electronic device according to claim 1 wherein the ends of said second trace portion and said third trace portion are shrunk with a preset distance from an end edge of said edge region toward said electronic device, respectively.

7. The electronic device according to claim 1 wherein an end edge of said edge region of said circuit board has an oblique.

8. The electronic device according to claim 1 wherein said electronic device is a power supply apparatus.

9. An electronic device comprising:
 a circuit board; and
 a power connection interface formed on an edge region of said circuit board, and including a trace portion for transmitting a DC voltage and at least a neutral wire and at least a live wire for transmitting an AC voltage, wherein plural trace wires of said trace portion are arranged on first and second surfaces of said edge region, and said neutral wire and said live wire are arranged on opposite surfaces of said edge region, wherein said neutral wire and said live wire are arranged on said first and second surfaces of said edge region, respectively.

10. The electronic device according to claim 9 wherein said power connection interface further includes an earth wire on one of said first and second surfaces of said edge region.

11. The electronic device according to claim 9 wherein said trace wires of said trace portion are discretely arranged at regular intervals on both surfaces of said edge region of said circuit board.

12. The electronic device according to claim 9 wherein said neutral wire is opposed to said live wire.

13. The electronic device according to claim 9 wherein the ends of said neutral wire and said live wire are shrunk with a preset distance from an end edge of said edge region toward said electronic device, respectively.

14. The electronic device according to claim 9 wherein an end edge of said edge region of said circuit board has an oblique.

15. The electronic device according to claim 9 wherein said electronic device is a power supply apparatus.

* * * * *